United States Patent
Kawate (10) Patent No.: US 11,124,646 B2
(45) Date of Patent: Sep. 21, 2021

(54) HEAT-DISSIPATING RESIN COMPOSITION, CURED PRODUCT THEREOF, AND METHOD OF USING SAME

(71) Applicant: 3M INNOVATIVE PROPERTIES COMPANY, St. Paul, MN (US)

(72) Inventor: Kohichiro Kawate, Tokyo (JP)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 145 days.

(21) Appl. No.: 16/320,639

(22) PCT Filed: Jul. 24, 2017

(86) PCT No.: PCT/US2017/043499
§ 371 (c)(1),
(2) Date: Jan. 25, 2019

(87) PCT Pub. No.: WO2018/026556
PCT Pub. Date: Feb. 8, 2018

(65) Prior Publication Data
US 2020/0181393 A1    Jun. 11, 2020

(30) Foreign Application Priority Data

Aug. 5, 2016 (JP) ............................. JP2016-154987

(51) Int. Cl.
| | | |
|---|---|---|
| C09J 163/00 | (2006.01) | |
| C08L 63/00 | (2006.01) | |
| H01L 23/29 | (2006.01) | |
| H01L 23/31 | (2006.01) | |
| H01L 23/373 | (2006.01) | |
| C08G 59/18 | (2006.01) | |
| C08L 63/04 | (2006.01) | |
| C08K 5/00 | (2006.01) | |
| C08L 33/06 | (2006.01) | |

(52) U.S. Cl.
CPC .............. C08L 63/04 (2013.01); C08G 59/18 (2013.01); C08K 5/0025 (2013.01); C08L 33/064 (2013.01); H01L 23/295 (2013.01); H01L 23/3121 (2013.01); H01L 23/3737 (2013.01); *C08L 2203/206* (2013.01); *C08L 2205/03* (2013.01); *C08L 2312/06* (2013.01)

(58) Field of Classification Search
None
See application file for complete search history.

(56) References Cited

U.S. PATENT DOCUMENTS

| | | | |
|---|---|---|---|
| 6,060,150 A | 5/2000 | Nakatani | |
| 6,136,758 A | 10/2000 | Yamada | |
| 6,174,841 B1 | 1/2001 | Yamada et al. | |
| 6,372,337 B2 | 4/2002 | Takahashi | |
| 6,818,600 B2 | 11/2004 | Yamada | |
| 7,358,570 B2 | 4/2008 | Aramatsu | |
| 7,538,075 B2 | 5/2009 | Yamada | |
| 7,602,051 B2 | 10/2009 | Ito | |
| 7,786,056 B2 | 8/2010 | Matsumoto | |
| 8,017,684 B2 | 9/2011 | Endo | |
| 8,304,469 B2 | 11/2012 | Kimura | |
| 8,465,666 B2 | 6/2013 | Asahi et al. | |
| 8,633,276 B2 | 1/2014 | Domae | |
| 10,125,237 B2 | 11/2018 | Tashiro et al. | |
| 2003/0125418 A1 | 7/2003 | Shibusawa | |
| 2003/0132494 A1 | 7/2003 | Tuttle | |
| 2004/0173877 A1 | 9/2004 | Takase | |
| 2005/0182172 A1 | 8/2005 | Kamimura | |
| 2006/0217499 A1* | 9/2006 | Takenaka | C08G 59/5033 525/533 |
| 2007/0042533 A1 | 2/2007 | Endo | |
| 2007/0082203 A1 | 4/2007 | Canelas | |
| 2007/0293624 A1 | 12/2007 | Matsumoto | |
| 2008/0213578 A1 | 9/2008 | Endo | |
| 2009/0258963 A1* | 10/2009 | Moore | C08G 59/50 522/100 |
| 2010/0006798 A1 | 1/2010 | Endo | |
| 2010/0059684 A1 | 3/2010 | Maltz | |
| 2011/0046267 A1 | 2/2011 | Tanaka et al. | |
| 2011/0261535 A1 | 10/2011 | Izutani | |
| 2011/0262728 A1 | 10/2011 | Izutani | |
| 2012/0153508 A1 | 6/2012 | Hayashi | |
| 2015/0311139 A1 | 10/2015 | Kim et al. | |
| 2017/0362428 A1* | 12/2017 | Kushihara | C08L 33/00 |

FOREIGN PATENT DOCUMENTS

| | | |
|---|---|---|
| EP | 3065151 | 9/2016 |
| JP | H06-080947 | 3/1994 |
| JP | H07-252377 | 10/1995 |
| JP | 10-60085 | 3/1998 |
| JP | 2001-081418 | 3/2001 |
| JP | 2001-139833 | 5/2001 |
| JP | 2001-214075 | 8/2001 |
| JP | 2004-010880 | 1/2004 |
| JP | 2004-161856 | 6/2004 |
| JP | 2005-206761 | 8/2005 |
| JP | 2005-330426 | 12/2005 |
| JP | 2006-114546 | 4/2006 |
| JP | 2006-137930 | 6/2006 |

(Continued)

OTHER PUBLICATIONS

International Search report for PCT International Application No. PCT/US2017/043499 dated Feb. 23, 2018, 7 pages.

*Primary Examiner* — Michael J Feely
(74) *Attorney, Agent, or Firm* — Clifton F. Richardson (57) ABSTRACT

To provide a heat-dissipating resin composition, and cured product thereof, which can effectively transmit heat generated from a heat-generating part such as a semiconductor element or the like with a high heating value to an object such as a substrate, heat sink, shield can lid, housing, or the like, and reduce defects such as contact failure of a relay or connector, or the like. A heat-dissipating resin composition of an embodiment of the present disclosure includes: component (A): epoxy resin; component (B): curing agent for epoxy resin; component (C): (meth)acrylic oligomer with weight average molecular weight of 10,000 or less; and component (D): heat conductive particles.

9 Claims, 5 Drawing Sheets

(56) References Cited

FOREIGN PATENT DOCUMENTS

| | | |
|---|---|---|
| JP | 2006-169343 | 6/2006 |
| JP | 2006-273948 | 10/2006 |
| JP | 2006-307030 | 11/2006 |
| JP | 2007-031695 | 2/2007 |
| JP | 2007-099821 | 4/2007 |
| JP | 2007-106809 | 4/2007 |
| JP | 2007-254688 | 10/2007 |
| JP | 2007-262392 | 10/2007 |
| JP | 2007-291344 | 11/2007 |
| JP | 2008-007590 | 1/2008 |
| JP | 2008-031336 | 2/2008 |
| JP | 2008-101227 | 5/2008 |
| JP | 2008-127502 | 6/2008 |
| JP | 2008-255275 | 10/2008 |
| JP | 2008-274141 | 11/2008 |
| JP | 2009-013340 | 1/2009 |
| JP | 2009-096961 | 5/2009 |
| JP | 2009-108162 | 5/2009 |
| JP | 2009-173855 | 8/2009 |
| JP | 2009-191214 | 8/2009 |
| JP | 2009-209230 | 9/2009 |
| JP | 2009-215362 | 9/2009 |
| JP | 2009-227947 | 10/2009 |
| JP | 2009-292928 | 12/2009 |
| JP | 2010-050239 | 3/2010 |
| JP | 2010-053224 | 3/2010 |
| JP | 2010-132856 | 6/2010 |
| JP | 2010-229269 | 10/2010 |
| JP | 2011-020870 | 2/2011 |
| JP | 2011-021069 | 2/2011 |
| JP | 2011-032364 | 2/2011 |
| JP | 2011-088953 | 5/2011 |
| JP | 2011-116890 | 6/2011 |
| JP | 2011-116913 | 6/2011 |
| JP | 2011-230472 | 11/2011 |
| JP | 2011-230947 | 11/2011 |
| JP | 2011-236376 | 11/2011 |
| JP | 2012-015273 | 1/2012 |
| JP | 2012-025907 | 2/2012 |
| JP | 2012-052137 | 3/2012 |
| JP | 2012-054511 | 3/2012 |
| JP | 2012-107152 | 6/2012 |
| JP | 2012-111823 | 6/2012 |
| JP | 2012-136575 | 7/2012 |
| JP | 2012-144638 | 8/2012 |
| JP | 2012-162650 | 8/2012 |
| JP | 2012-224711 | 11/2012 |
| JP | 2012-224758 | 11/2012 |
| JP | 2012-251089 | 12/2012 |
| JP | 2016-048804 | 4/2016 |
| KR | 2006-0089564 | 8/2006 |
| KR | 102006-0089654 | 8/2006 |
| WO | WO 2012-039324 | 3/2012 |
| WO | WO 2015-127179 | 8/2015 |
| WO | WO 2016-060901 | 4/2016 |

\* cited by examiner

HEAT-DISSIPATING RESIN COMPOSITION, CURED PRODUCT THEREOF, AND METHOD OF USING SAME

TECHNICAL FIELD

The present disclosure relates to a heat-dissipating resin composition and cured product thereof.

BACKGROUND ART

Heat-generating parts of semiconductor elements may cause defects such as reduced performance, damage, or the like, due to generation of heat during use. Conventionally, a heat-dissipating material that can transmit heat generated from a heat-generating part to a substrate, heat sink, or the like in order for the heat to be removed to the outside has been proposed in order to resolve these defects.

Patent Literature 1 (Japanese Unexamined Patent Application Publication No. 2000-109373) describes a heat-dissipating silicone grease composition formed by adding: (A) 50 to 95 wt % of an aluminum nitride powder with an average particle size of 0.5 to 10 μm, and not including particles with a particle size of 100 μm or larger; and (B) 5 to 50 wt % of liquid silicone with a viscosity at 25° C. of 50 to 500,000 cs.

Patent Literature 2 (Japanese Unexamined Patent Application Publication No. H06-080947) describes an epoxy resin composition that can be used as an insulating adhesive layer of a high heat heat-dissipating wiring board, formed by including as essential components: (A) an epoxy resin; (B) one type or a mixture of two or more types of (1) a bisphenol polyalkylene oxide adduct, (2) polyalkylene oxide adduct of a novolac phenol, (3) glycidyl ether of a bisphenol polyalkylene oxide adduct, and (4) glycidyl ether of a polyalkylene oxide adduct of a novolac phenol; (C) a diamino diphenyl sulfone; (D) one type or a mixture of two or more types of (a) imidazole compound, (b) boron trifluoride amine complex compound, and (c) dicyandiamide; and (E) an inorganic filler with 60 to 80 wt % of solid content.

CITATION LIST

Patent Literature

Patent Document 1: Japanese Unexamined Patent Application Publication No. 2000-109373
Patent Document 2: Japanese Unexamined Patent Application Publication No. H06-080947

SUMMARY OF THE INVENTION

Problem to be Solved by the Invention

Heat-dissipating silicone grease widely used as a heat-dissipating material for semiconductor parts contains liquid silicone containing a low molecular weight silicone compound. The low molecular weight silicone compound may cause a phenomenon of diffusing to the periphery (oil bleeding), which may inhibit a soldering step or the like. Specifically, when a silicone film is formed on a substrate or semiconductor electrode, solder wettability of the electrode may deteriorate. Therefore, the silicone grease is generally coated on a semiconductor after soldering or the like is completed. Furthermore, contact failure of a relay or connector, hard disk crashing, and the like have been reported in electronic equipment due to the silicone, and thus the use of silicone grease is often restricted. Furthermore, when attempting to improve the heat conductivity of the silicone grease, the viscosity will generally increase. Therefore, highly heat conductive silicone grease is difficult to coat using a dispenser, and is often coated by a hand operation. This method is limited to a narrow range and has a problem where coating is difficult.

Heat conductive material including a heat conductive inorganic filler, epoxy resin, and the like are also known. In recent years, expensive semiconductor parts, substrates, and the like are being reused, and therefore, a heat conductive material exhibiting reworkability is also desired. However, when a heat conductive material including epoxy resin and the like is cured, a cured product exhibiting rubber elasticity and a high cohesive force is obtained, and therefore, even if heating is performed, detaching from the semiconductor part, substrate, or the like may be difficult, which may destroy the product.

The present disclosure provides a heat-dissipating resin composition, and cured product thereof, which can effectively transmit heat generated from a heat-generating part such as a semiconductor element or the like with a high heating value to an object such as a substrate, heat sink, shield can lid, housing, or the like, and reduce defects such as contact failure of a relay or connector, or the like.

Means to Solve the Problem

According to an embodiment of the present disclosure, a heat-dissipating resin composition is provided, including: component (A): epoxy resin; component (B): curing agent for epoxy resin; component (C): (meth)acrylic oligomer with weight average molecular weight of approximately 10,000 or less; and component (D): heat conductive particles.

According to another embodiment of the present disclosure, a heat-dissipating cured product is provided, in which the heat-dissipating resin composition is cured.

Effect of the Invention

The present disclosure provides a heat-dissipating resin composition, and cured product thereof, which can effectively transmit heat generated from a heat-generating part such as a semiconductor element or the like with a high heating value to an object such as a substrate, heat sink, shield can lid, housing, or the like, and reduce defects such as contact failure of a relay or connector, or the like.

The present disclosure provides a cured product of the heat-dissipating resin composition that exhibits reworkability.

The present disclosure provides a heat-dissipating resin composition for which coating is possible by a dispenser.

The above descriptions should not be construed to be a disclosure of all of the embodiments and benefits of the present invention.

DESCRIPTION OF EMBODIMENT

The heat-dissipating resin composition according to a first embodiment includes: component (A): epoxy resin; component (B): curing agent for epoxy resin; component (C): (meth)acrylic oligomer with weight average molecular weight of approximately 10,000 or less; and component (D): heat conductive particles. The heat-dissipating resin composition can effectively transmit heat to an object such as a heat sink or the like, and does not contain silicone, and therefore can reduce defects such as contact failure of a relay or connector, and the like.

In the heat-dissipating resin composition of the first embodiment, component (C) may be component (C-1): (meth)acrylic oligomer with a weight average molecular weight of approximately 10,000 or less that does not have a carboxyl group, and/or component (C-2): (meth)acrylic oligomer with a weight average molecular weight of approximately 10,000 or less that has a carboxyl group. Component (C-1) can improve hydrophobicity and insulating properties, and component (C-2) can improve dispersibility of heat conductive particles exhibiting basicity, and fluidity of a heat-dissipating resin composition including these particles.

With the heat-dissipating resin composition according to the first embodiment, the following equation (1) may be satisfied when the weight fraction of components (A) to (C) is set to $W_A$, $W_B$, and $W_C$. When the ratio of the components (A) to (C) are within this range, the flow condition before curing, plastic deformation after curing, reworkability, and the like will be excellent.

[Equation 1]

$$1 \leq W_C/(W_A+W_B) \leq 13 \quad (1)$$

With the heat-dissipating resin composition according to the first embodiment, the following equation (2) may be satisfied when the weight fraction of components (C-1) and (C-2) is set to $W_{C-1}$ and $W_{C-2}$. When the ratio of components (C-1) and (C-2) is within this range, dispersibility of heat conductive particles exhibiting basicity, and fluidity of a heat-dissipating resin composition including these particles can be further improved.

[Equation 2]

$$W_{C-2}/(W_{C-1}+W_{C-2}) \geq 0.05 \quad (2)$$

With the heat-dissipating resin composition according to the first embodiment, the following equation (3) may be satisfied when the weight fraction of component (D) is set to $W_D$. When the ratio of component (D) is within this range, the heat dissipating properties can be further improved.

[Equation 3]

$$W_D \geq 70 \quad (3)$$

The heat-dissipating resin composition according to the first embodiment can be cured to obtain a heat-dissipating cured product. The cured product exhibits plastic deformation, and therefore, deformation occurs when pressing a semiconductor part placed on the cured product, and thus the shape thereof can be maintained, for example. Therefore, stress due to deformation added to the semiconductor part or the like can be greatly reduced as compared to an epoxy cured product which is a conventional rubber elastic body. Furthermore, the cohesive force is reduced as compared to a conventional epoxy cured product, and therefore, a semiconductor part and substrate can be easily detached.

A method for mounting a semiconductor element, using the heat-dissipating resin composition or cured product thereof according to the first embodiment, includes the steps of: (1) applying the heat-dissipating resin composition or the heat-dissipating cured product which is a cured product thereof onto a substrate with an electrode; (2) placing a semiconductor element with an electrode on the applied heat-dissipating resin composition or heat-dissipating cured product, and if necessary, heating and/or pressurizing, where in step (2), the substrate and electrode of the semiconductor element are joined through a conductive member; (3) curing the heat-dissipating resin composition by heat or ionizing radiation, if the heat-dissipating resin composition in the aforementioned step (1) is used; and (4) optionally reworking by removing the substrate and semiconductor element; where the aforementioned curing step (3) is performed either during step (1) or step (2).

A method of mounting a semiconductor element and heat sink, using the heat-dissipating resin composition or cured product thereof according to the first embodiment, includes the steps of: (1) placing a substrate having a first surface with an electrode, and a semiconductor element having a first surface with an electrode and a second surface opposite from the first surface such that the first surfaces are facing each other, through an underfill agent and/or conductive member; (2) applying onto the second surface of the semiconductor element the heat-dissipating resin composition or the heat-dissipating cured product which is a cured product thereof; (3) heating and/or pressurizing, such that in step (3), the semiconductor element and substrate are joined, performed after the aforementioned step (1) or step (2); (4) placing a heat sink on the applied heat-dissipating resin composition or heat-dissipating cured product, and then if necessary, heating and/or pressurizing; (5) curing the heat-dissipating resin composition by heat or ionizing radiation, if the heat-dissipating resin composition is used in the aforementioned step (2); and (6) optionally reworking by removing the heat sink and semiconductor element; where the aforementioned curing step (5) is performed during any of steps (2) to (4).

A method of mounting a semiconductor element inside a shield can, using the heat-dissipating resin composition or cured product thereof according to the first embodiment, includes the steps of: (1) placing a substrate having a first surface with a shield can and an electrode, and a semiconductor element having a first surface with an electrode and a second surface on an opposite side from the first surface, placed inside the shield can, such that the first surfaces are facing each other, with an underfill agent and/or conductive member provided therebetween; (2) applying onto the second surface of the semiconductor element the heat-dissipating resin composition or the heat-dissipating cured product which is a cured product thereof; (3) heating and/or pressurizing such that in step (3), the semiconductor element and substrate are joined, performed after the aforementioned step (1) or step (2); (4) placing a shield can lid on the applied heat-dissipating resin composition or heat-dissipating cured product, and then if necessary, heating and/or pressurizing; (5) curing the heat-dissipating resin composition by heat or ionizing radiation, if the heat-dissipating resin composition is used in the aforementioned step (2); and (6) optionally reworking by removing the shield can lid and semiconductor element; where the aforementioned curing step (5) is performed during any of steps (2) to (4).

A method of mounting a semiconductor element inside a housing, using the heat-dissipating resin composition or cured product thereof according to the first embodiment, comprising the steps of: (1) heating and/or pressurizing, if necessary, to join a substrate having a first surface with an electrode, and a semiconductor element having a first surface with an electrode and a second surface on an opposite side from the first surface such that the first surfaces are facing each other, with an underfill agent and/or conductive member provided therebetween; (2) applying onto the second surface of the semiconductor element the heat-dissipating resin composition or the heat-dissipating cured product which is a cured product thereof; (3) placing a housing onto the applied heat-dissipating resin composition or heat-dissipating cured product, and if necessary, heating and/or pressurizing and spreading the heat-dissipating resin composition or heat-dissipating cured product to be larger than the area of the second area of the semiconductor element; (4) curing the heat-dissipating resin composition by heat or ionizing radiation, if the heat-dissipating resin composition is used in the aforementioned step (2); and (5) optionally reworking by removing the housing and semiconductor element; where the aforementioned curing step (4) is performed during either step (2) or step (3).

The mounting methods use the heat-dissipating resin composition or cured product thereof according to the first embodiment, and therefore can dissipate heat by effectively transmitting heat generated from a part such as a semiconductor element or the like with a high heating value to an object such as a substrate, heat sink, shield can lid, housing, or the like, and thus reduce defects such as contact failure of a relay or connector, and if necessary, reworking can be performed. The cured product of the heat-dissipating resin composition achieves plastic deformation performance without rubber elasticity, and therefore, stress from a reaction occurring due to deformation is overwhelmingly lower than with an elastic material. Therefore, uneeded stress is not applied to the semiconductor, substrate, heat sink, shield can lid, housing, or the like, and thus problems such as reduced product performance, defective appearance, and the like can be improved.

The mounting methods can use a dispenser if the heat-dissipating resin composition according to the first embodiment is applied on a substrate or the like. The heat-dissipating resin composition before curing is in a high fluid condition to the extent that a dispenser can be used. Using a dispenser enables computer control, application to a local site, and the like, and therefore, the heat-dissipating resin composition can be coated at a desired position only on a substrate or semiconductor for example, and thus the production efficiency can be greatly improved.

For the purpose of illustrating typical embodiments of the present invention by way of example, typical embodiments are described in detail below, but the present invention is not limited to these embodiments.

In the present disclosure, the term "oligomer" refers to a polymer with a weight average molecular weight of approximately 10,000 or less, in which at least two monomers are bonded.

In the present disclosure, the term "(meth)acrylic" refers to acrylic or methacrylic, and the term "(meth)acrylate" refers to acrylate or methacrylate.

The heat-dissipating resin composition of an embodiment of the present disclosure includes: component (A): epoxy resin; component (B): curing agent for epoxy resin; component (C): (meth)acrylic oligomer with weight average molecular weight of approximately 10,000 or less; and component (D): heat conductive particles.

Examples of the epoxy resin of component (A) may include any epoxy resin known in this technical field, but in order to function as a binder for heat conductive particles, the resin is preferably a liquid at ambient temperature. The epoxy resin preferably has a viscosity at 25° C. before curing that is approximately 0.1 Pa·s or higher, approximately 0.5 Pa·s or higher, approximately 1 Pa·s or higher, and approximately 200 Pa·s or less, approximately 150 Pa·s or less, or approximately 100 Pa·s or less. The viscosity of the epoxy resin can be measured using a Brookfield rotational viscometer, for example.

Examples of epoxy resins that are liquid at ambient temperature may include: bisphenol epoxy resins derived from epichlorohydrin and bisphenols A, F, AD, and the like with a weight average molecular weight of approximately 200 to approximately 500; epoxy novolac resins derived from epoxychlorohydrin and phenol novolac or cresol novolac; naphthalene epoxy resins having a skeleton including a naphthalene ring; various epoxy compounds having two or more glycidyl amines, glycidyl ethers, or other glycidyl group in one molecule of a biphenol, dicyclopentadiene, or the like; alicyclic epoxy compounds having two or more alicyclic epoxy groups in one molecule; and mixtures of two or more thereof. Specific examples can include EPICOAT (registered trademark) EP828 (bisphenol A type, epoxy equivalent: 190 g/eq., manufactured by Japan Epoxy Resins Co. Ltd.), YD128 (bisphenol A type, epoxy equivalent: from 184 to 194 g/eq., Tohto Kasei Co., Ltd.), FDF-170 (bisphenol F type, epoxy equivalent: 170 g/eq/, manufactured by Nippon Steel & Sumikin Chemical Co., Ltd.), EPICOAT (registered trademark) EP807 (bisphenol F type, manufactured by Japan Epoxy Resins Co. Ltd.), EXA7015 (hydrogenerated bisphenol A type, manufactured by DIC), EP4088 (dicyclopentadiene type, manufactured by ADEKA), HP4032 (naphthalene type, manufactured by DIC), PLACCEL (registered trademark) G402 (lactone modified type, epoxy equivalent: from 1050 to 1450 g/eq., manufactured by Daicel Chemical Industries, Ltd.), and Celloxide 2021 (alicyclic type, manufactured by Daicel Chemical Industries, Ltd.), and the like. The heat-dissipating resin composition of the present disclosure may include one type or a mixture of two types or more of the aforementioned epoxy resins.

Examples of epoxy resin curing agents of component (B) include polyaddition curing agents, catalyst curing agents, condensation curing agents, and the like. The curing agents can be used individually or in combinations of two or more, based on the properties of the curing material and the type of epoxy resin.

Examples of polyaddition curing agents include polyamine compounds such as diethylenetriamine (DETA), triethylenetetramine (TETA), metaxylylene diamine (MXDA), and other aliphatic polyamines, diaminodiphenyl methane (DDM), m-phenylenediamine (MPDA), diaminodiphenyl sulfone (DDS), and other aromatic polyamines, dicyandiamide (DICY), organic acid dihydrazides, and the like; anhydrides including alicyclic acid anhydrides such as hexahydro phthalic anhydride (HHPA), methyl tetrahydro phtalic anhydride (MTHPA), and aromatic acid anhydrides such as trimellitic anhydride (TMA), pyromellitic dianhydride (PMDA), benzophenone tetracarboxylic dianhydride (BTDA), and the like; polyphenol compounds such as novolac phenolic resins, phenol polymers, and the like; polymercaptan compounds such as polysulfides, thioesters, thioethers, and the like; isocyanate compounds such as isocyanate prepolymers, blocked isocyanates, and the like; organic acids such as polyester resins containing carboxylic acids; and the like.

Examples of catalyst curing agents include benzyl dimethyl amine (BDMA), 2,4,6-tris dimethylaminomethyl phenol (DMP-30), and other tertiary amine compounds, 2-methyl imidazole, 2-ethyl-4-methyl imidazole (EM124), and other imidazole compounds, BF3 complex and other Lewis acids, and the like.

Examples of condensation curing agents include resole phenolic resins and other phenolic resins, urea resins containing a methylol group and other urea resins, melamine resins containing a methylol group and other melamine resins, and the like.

In consideration of the curability of the heat-dissipating resin composition, as well as the plastic deformation properties, reworkability, heat dissipating properties, and the like of the cured product, the curing agents can be used at an amount of approximately 0.1 parts by mass or more, approximately 1 parts by mass or more, or approximately 2 parts by mass or more, and approximately 150 parts by mass or less, approximately 100 parts by mass or less, approximately 50 parts by mass or less, approximately 20 parts by mass or less, approximately 15 parts by mass or less, or approximately 10 parts by mass or less, with regard to 100 parts by mass of the epoxy resin component.

The epoxy resin curing agent of component (B) can use a latent curing agent. A latent curing agent is a curing agent that does not express curability at ambient temperature and in which curing of the epoxy resin included in the heat-dissipating resin composition does not advance, but demonstrates curability and can cure the epoxy resin to a desired level when heated.

Examples of latent curing agents that can be used include imidazoles, hydrazides, and other hydrazines, boron trifluoride-amine complexes, aminimides, polyamines, tertiary amines, alkyl ureas, and other amine compounds, dicyandiamides, modified products thereof, and mixtures of two or more types thereof.

Of the aforementioned latent curing agents, imidazole latent curing agents are preferred. The imidazoles latent curing agents may include an adduct of an imidazole compound and epoxy resin, and examples of the imidazole compound include imidazoles, 2-methyl imidazoles, 2-ethyl imidazoles, 2-propyl imidazoles, 2-dodecyl imidazoles, 2-phenyl imidazoles, 2-phenyl-4-methyl imidazoles, and 4-methyl imidazoles.

Furthermore, in order to enhance two conflicting properties, namely, storage stability and short-term curability, an encapsulated curing agent having the aforementioned latent curing agent as a core, coated by a polyurethane-based, polyester-based, or other polymeric substances, or by a metal thin film of Ni, Cu, or the like may be used as the latent curing agent of the present invention. Of these encapsulated curing agents, an encapsulated imidazole is preferably used.

Examples of the encapsulated imidazoles can include: imidazole latent curing agents encapsulated by adducting an imidazole compound with urea or an isocyanate compound, and then blocking the surface thereof with an isocyanate compound; and imidazole laten curing agents encapsulated by adducting an imidazole compound with an epoxy compound, and then blocking the surface thereof with an isocyanate compound. Specific examples can include HX3941HP, HXA3042HP, HXA3922HP, HXA3792, HX3748, HX3721, HX3722, HX3088, HX3741, HX3742, HX3613, and the like of the Novacure (registered trademark) series. Note that Novacure (registered trademark) is a product in which encapsulated imidazole and thermosetting epoxy resin are mixed at a certain ratio.

Furthermore, the amine latent curing agents that can be used in the present invention may include amine latent curing agents known in this technical field, and examples include polyamines (such as H-4070S, H-3731S, and the like manufactured by ACR), tertiary amines (such as H3849S manufactured by ACR), alkyl urea (such as H-3366S manufactured by ACR), and the like.

The latent curing agent can be used at an amount that is approximately 1 parts by mass or more, approximately 10 parts by mass or more, or approximately 15 parts by mass or more, and approximately 50 parts by mass or less, approximately 40 parts by mass or less, or approximately 30 parts by mass or less, with regard to 100 parts by mass of the epoxy resin component. Herein, if a commercial product of a mixture between an epoxy resin and latent curing agent is used, the content of the latent curing agent indicates the ratio of a latent curing agent component included in the mixture, based on the total mass of an epoxy resin component and other epoxy resin components in the mixture. As the reaction initiating temperature (also referred as activating temperature) of the latent curing agent increases, the storage stability of the heat-dissipating resin composition can be increased, and as the reaction initiating temperature decreases, curing can be performed in a short period of time. In order to establish both short-term curability and storage stability to as high of a level as possible, the reaction initiating temperature of the latent curing agent is preferably approximately 50° C. or higher or approximately 100° C. or higher, and approximately 200° C. or lower or approximately 180° C. or lower. Herein, the reaction initiating temperature (activating temperature) of the latent curing agent refers to a temperature at a point where the tangent line of the temperature on a low temperature side where the amount of heat generated is at ½ of the peak intersects with the baseline on a DSC curve obtained when increasing the temperature of a mixture of the epoxy resin and the latent curing agent as a test sample at a rate of 10° C./minute from room temperature, using a DSC (differential scanning calorimeter).

The composition including an epoxy resin can include a polymerization initiator in place of using the curing agent or in conjunction with the curing agent, and may by photocured by ionizing radiation. The type of ionizing radiation is not particularly limited, and examples include X-rays, electron beams, ultraviolet rays, visible light, infrared rays, and the like, but ultraviolet rays are widely used. A cationically polymerizable initiator can be used as the polymerization initiator. Photo-cationic polymerization initiators are not particularly limited, and conventionally known initiators can be used. Examples include "CYRACURE (registered trademark) UVI-6990, 6974" manufactured by UCC, "ADEKA OPTOMER (registered trademark) SP-150, 152, 170, 172" manufactured by ADEKA, "Photoinitiator 2074" manufactured by Rhodia, "Irgacure (registered trademark) 250"

manufactured by Ciba Specialty, "DTS-102" manufactured by Midori Kagaku, and the like. The polymerization initiator can be use independently or in a combination of two or more types. The amount of the polymerization initiator used can be approximately 0.01 mass % or more or approximately 0.1 mass % or more, and approximately 10 mass % or less or approximately 5 mass % or less, with regard to the epoxy resin.

The (meth)acrylic oligomer with a weight average molecular weight of 10,000 or less of the component (C) can be obtained by polymerizing a compound having a (meth) acryloyl group. Examples of the compound having a (meth) acryloyl group include (meth)acrylate monomers. Specific examples of (meth)acrylic acid alkyl esters include methyl (meth)acrylate, ethyl (meth)acrylate, propyl (meth)acrylate, isopropyl (meth)acrylate, butyl (meth)acrylate, pentyl (meth)acrylate, hexyl (meth)acrylate, 2-ethylhexyl (meth) acrylate, octyl (meth)acrylate, nonyl (meth)acrylate, lauryl (meth)acrylate, methoxyethyl (meth)acrylate, methoxybutyl (meth)acrylate, ethoxybutyl (meth)acrylate, polyethylene glycol (meth)acrylate, methoxy polyethylene glycol (meth) acrylate, phenoxy polyethylene glycol (meth)acrylate, polyethylene glycol di(meth)acrylate, (meth)acrylate of an ethylene oxide/tetrahydrofuran copolymers, (meth)acrylate of an ethylene oxide/propylene oxide copolymers, polyethylene glycol monoallyl ether, and the like. The glass transition temperature (Tg) of the (meth)acrylic oligomer after polymerizing is preferably room temperature or lower.

The (meth)acrylic oligomer of component (C) may include a carboxyl group. A (meth)acrylic oligomer including a carboxyl group is referred to as component (C-2), and a (meth)acrylic oligomer not including a carboxyl group is referred to as component (C-1). Examples of the monomer having a carboxyl group include (meth)acrylic acids, carboxyethyl (meth)acrylates, carboxypentyl (meth)acrylates, and the like. One or more types of the monomers can be copolymerized with the aforementioned compound having a (meth)acryloyl group to obtain component (C-2). Component (C-1) can improve hydrophobicity and insulating properties of the heat-dissipating resin composition and cured product thereof, and component (C-2) can improve dispersibility of heat conductive particles exhibiting basicity, and fluidity of a heat-dissipating resin composition including the particles.

The polymerizing method is not particularly limited, and a conventionally known method may be used, such as bulk polymerization, solution polymerization, emulsion polymerization, suspension polymerization, and the like. An initiator, chain transfer agent, emulsifier, suspension agent, and other various auxiliary agents can be used, based on the polymerizing method. Of these, bulk polymerization and solution polymerization are preferred from the perspective of reduced residual impurities and easy control of the weight average molecular weight of the oligomer region.

The weight average molecular weight of the (meth)acrylic oligomer of component (C) can be determined by gel osmotic pressure chromatography using polystyrene as a standard substance. So long as the weight average molecular weight of the (meth)acrylic oligomer is approximately 10,000 or less, the oligomer can be widely used as a material for heat dissipation. When considering cohesion, plastic deformation, adaptability to a dispenser, and the like, the weight average molecular weight is preferably approximately 100 or more, approximately 500 or more, or approximately 1000 or more, and approximately 10000 or less, approximately 8000 or less, or approximately 5000 or less.

In a certain embodiment, the heat-dissipating resin composition may satisfy the following equation (1) when the weight fraction (mass %) of components (A) to (C) is set to $W_A$, $W_B$, and $W_C$. When the ratio of the components (A) to (C) are within this range, the flow condition before curing, adaptability to a dispenser, plastic deformation after curing, reworkability, and the like will be excellent.

[Equation 4]

$$X \leq W_C/(W_A+W_B) \leq Y \tag{1}$$

(Where X represents 1, 2, or 3; and Y represents 13, 10, or 8.)

In a certain embodiment, the heat-dissipating resin composition may satisfy the following equation (2) when the weight fraction (mass %) of components (C-1) and (C-2) are set to $W_{C-1}$ and $W_{C-2}$. Inorganic particles such as alumina or the like generally exhibit basicity. The (meth)acrylic oligomer including a carboxyl group of the component (C-2) is bonded to a surface of inorganic particles exhibiting basicity, and therefore, the dispersibility of the particles is improved, and the fluidity of the entire heat-dissipating resin composition is also improved. If the weight fraction (WC-2) of the component (C-2) is 0%, the viscosity of the heat-dissipating resin composition may increase and solidify, or phase separation of the component (C-1) with the epoxy resin may occur. Therefore, the ratio between components (C-1) and (C-2) preferably satisfies the following equation (2).

[Equation 5]

$$W_{C-2}/(W_{C-1}+W_{C-2}) \geq Z \tag{2}$$

(Where Z represents 0.05, 0.07, or 0.1.)

The acid value of the (meth)acrylic oligomer including a carboxyl group, which is component (C-2) may be approximately 5 mg KOH/g or more, approximately 10 mg KOH/g or more, or approximately 50 mg KOH/g or more, and approximately 300 mg KOH/g or less, approximately 200 mg KOH/g or less, or approximately 150 mg KOH/g or less.

The heat conductive particles of component (D) of the heat-dissipating resin composition may be insulating or conductive. Examples of insulating heat conductive particles can include boron nitride, aluminum nitride, silicon nitride, and other nitrogen compounds, aluminum oxide (alumina), magnesium oxide, zinc oxide, silicon oxide, beryllium oxide, titanium oxide, copper oxide, copper suboxide, and other metal oxides, magnesium hydroxide, aluminum hydroxide, and other metal hydroxides, magnesite (magnesium carbonate), silicon carbide, diamond, and other carbon compounds, silica, talc, mica, kaolin, bentonite, pyroferrite, and other ceramics, titanium boride, calcium titanate, and the like.

Of these, aluminum oxide (alumina), aluminum hydroxide, zinc oxide, boron nitride, and aluminum nitride are preferred from the perspective of heat conductivity and the like. Note that boron nitride may have any structure such as c-BN (cubic structure), w-BN (wurtzite structure), h-BN (hexagonal structure), r-BN (rhombohedral structure), t-BN (turbostratic structure), and the like. The shape of boron nitride is either spherical or scaly, and either can be used.

Examples of the conductive heat conductive particles can include graphite, carbon black, graphite, carbon fiber (pitch, PAN), carbon nanotube (CNT), carbon nanofiber (CNF), and other carbon compounds, silver, copper, iron, nickel, aluminum, titanium, and other metals or metal alloys thereof, stainless steel (SUS), zinc oxide doped with different elements, and other conductive metal oxides, ferrites, and other metal compounds. The conductive heat conductive particles can be made insulative by coating with silica or other insulating material, and these particles can be used as the heat conductive particles.

The heat conductive particles can be used independently or in a combination of two or more. The shape of the heat conductive particles can be various shapes, and examples include fibers, plates, scales, bars, granules, rods, tubes, curved plates, needles, curved plates, needles, and the like. The heat conductive particles may be treated by a silane coupling treatment, titanate coupling treatment, epoxy treatment, urethane treatment, oxide treatment, or other surface treatment.

If the weight fraction (mass %) of the heat conductive particles of component (D) is set to $W_D$, the following equation (3) may be satisfied. When considering fluidity before curing, heat dissipating properties, and the like of the heat-dissipating resin composition, the ratio of the component (D) is preferably within this range.

[Equation 6]

$$W_D \geq V \quad (3)$$

(Where V represents 70, 75, or 80.)

The average particle size of the heat conductive particles may be 0.1 μm or more, 0.2 μm or more, or 0.3 μm or more, and 100 μm or less, 70 μm or less, or 50 μm. The heat conductive particles can concomitantly use at least two particles with different average particle sizes. When this configuration is used, heat conductive particles with a small particle size are filled between particles with a large particle size and packed in a closest packing condition, and therefore, heat conductivity is improved. The average particle size and particle size distribution of the heat conductive particles can be measured by an electron microscope, laser diffracted light scattering device, or the like. Furthermore, if two particles with different average particle sizes are combined for example, two peaks are observed in the particle size distribution of the heat-dissipating resin composition including the particles. Therefore, by confirming the number of peaks in the particle size distribution of the heat-dissipating resin composition, the number of particles with different particle sizes included in the heat-dissipating resin composition can be confirmed.

The heat-dissipating resin composition may further include a flame retardant, pigment, dye, filler, reinforcing material, leveling agent, defoaming agent, dispersant, curing promoting agent, reactive diluting agent, solvent, or other additive. The added amount of the additives can be appropriately determined within a range that does not impair the effect of the present invention.

Figure 1:
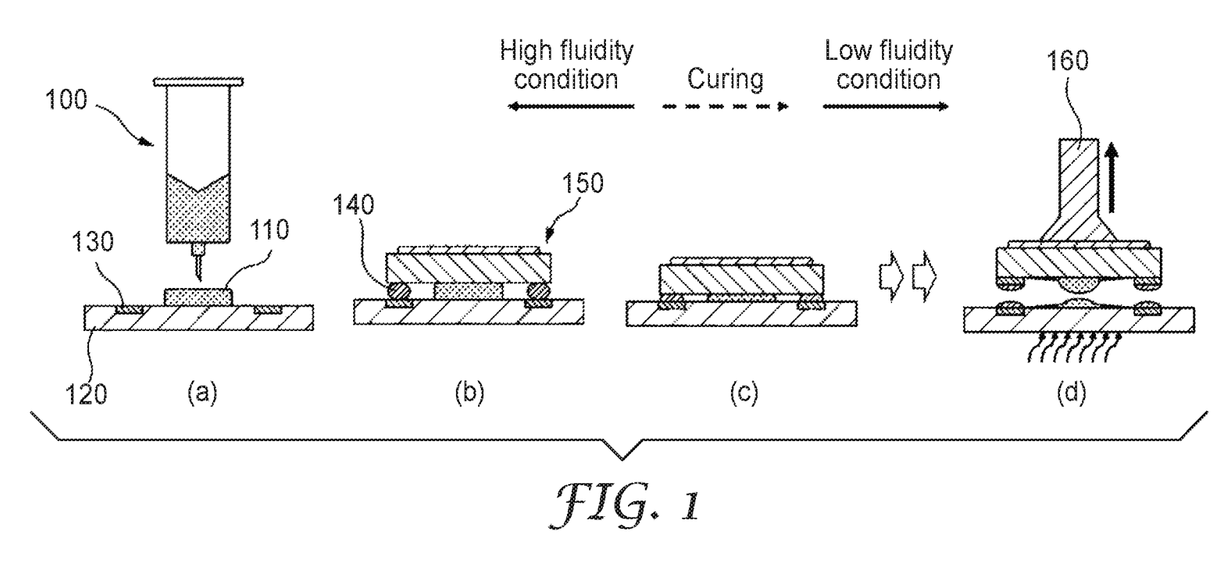
FIG. 1 is a schematic view illustrating a method of using a heat-dissipating resin composition according to an embodiment of the present disclosure.

The heat-dissipating resin composition of the present disclosure can be cured by heating and/or ionizing radiation (X-rays, electron beams, ultraviolet rays, visible light, infrared rays, or the like). The heat-dissipating resin composition before curing has high fluidity as compared to after curing, and therefore, a coating device such as a dispenser or the like can be used. On the other hand, the heat-dissipating resin composition of the present disclosure also include component (C) in addition to components (A) and (B), and therefore, a low fluidity condition is achieved after curing as compared to before curing, but a cured product exhibiting rubber elasticity and high cohesive force is not obtained as with materials including a conventional epoxy resin and curing agent, and thus plastic deformation and an appropriate cohesive force are exhibited. Therefore, with the heat-dissipating resin composition of the present disclosure, the shape of the cured product can be freely deformed and maintained even after curing, and the composition can be removed if necessary. Therefore, curing of the heat-dissipating resin composition may be performed by any of steps (a) to (c) when forming the heat-dissipating cured product between the substrate and semiconductor element as illustrated in FIG. 1, for example, but the heat-dissipating resin composition can be cured on a separate manufacturing line to prepare a heat-dissipating cured product, and then the heat-dissipating cured product can be applied between the substrate and semiconductor element. If necessary, the semiconductor part or substrate attached with the heat-dissipating cured product can be removed and reworked.

The heat dissipating performance (heat conductivity) of the heat-dissipating resin composition of the present disclosure and the heat-dissipating cured product in which the composition is cured can be approximately 1.0 W/mK or more or approximately 1.2 W/mK or more.

For the purpose of illustrating typical embodiments of the present invention, typical embodiments of the present invention are described in detail below while referring to the drawings, but the present invention is not limited to the embodiments. For the reference numerals in the drawings, elements denoted with similar numbers for different drawings are similar or corresponding elements.

Methods of using the heat-dissipating resin composition of the present disclosure are described by way of example while referring to FIGS. 1 to 4, but the methods of using the heat-dissipating resin composition are not limited thereto. FIGS. 1 to 4 illustrate a method using a cylinder type dispenser.

FIG. 1 illustrates a method of mounting a semiconductor element to a substrate, which includes step (a) to step (d). In step (a), a heat-dissipating resin composition 110 is coated onto a substrate 120 with an electrode 130, from a cylinder 100 containing the heat-dissipating resin composition. Herein, heat or ionizing radiation may be applied to cure the heat-dissipating resin composition 110. In step (b), a semiconductor element 150 is placed on the heat-dissipating resin composition 110 and substrate 120 with the conductive member 140 such that the heat-dissipating resin composition 110 is placed between the substrate 120 and a semiconductor element 150 such as a CMOS sensor or the like, and an electrode (not illustrated in the drawing) of the semiconductor element 150 and the electrode 130 of the substrate 120 are joined through the conductive member 140 made of solder, anisotropic conductive material, or the like. In step (c), if solder is used for the conductive member 140, heat during solder connection can be used to heat cure the heat-dissipating resin composition 110. Alternatively, heat or ionizing radiation can be separately applied to cure the heat-dissipating resin composition 110, without using heat during solder connection. If an anisotropic conductive material is used for the conductive member 140, heat or ionizing radiation can be separately applied to cure the heat-dissipating resin composition 110. Herein, in step (c), pressure may be applied if necessary. Optionally, in step (d), the solder can be melted by heating, the semiconductor element 150 can be raised using raising means 160 such as a vacuum chuck or the like, and therefore, the semiconductor element 150 and substrate 120 can be removed, and the members can be reworked.

Figure 2:
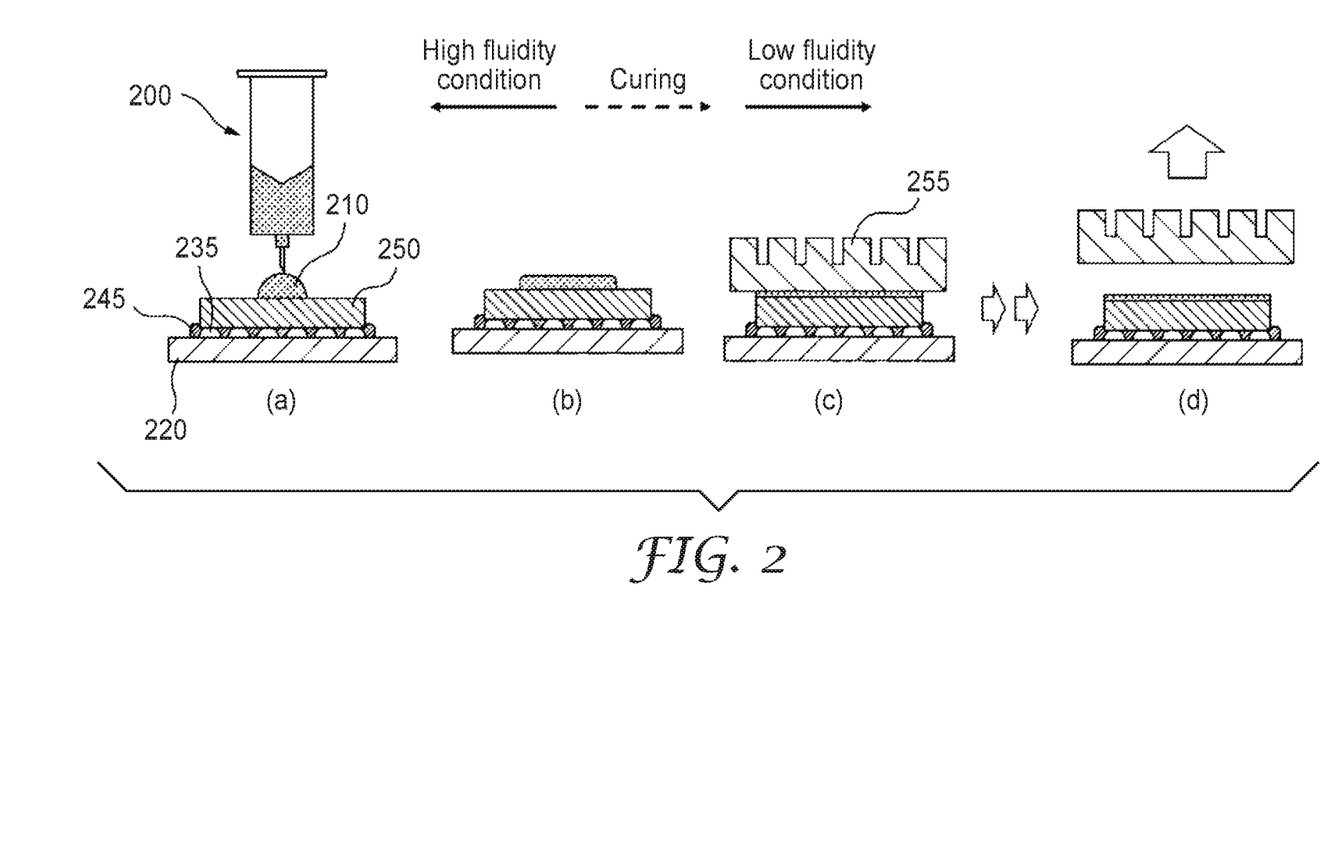
FIG. 2 is a schematic view illustrating another method of using a heat-dissipating resin composition according to an embodiment of the present disclosure.

FIG. 2 illustrates a method of mounting a semiconductor element and heat sink, which includes step (a) to step (d). In step (a), a substrate 220 having a first surface with an electrode (not illustrated in the drawing), and a semiconductor element 250 having a first surface with an electrode (not illustrated in the drawing) and a second surface on an opposite side from the first surface are placed with an underfill material 245 and/or conductive member 235 such as a solder ball, anisotropic conductive material, or the like such that the first surfaces of both members are opposite, and then a heat-dissipating resin composition 210 is coated onto the second surface of the semiconductor element 250, from a cylinder 200 containing the heat-dissipating resin composition. Herein, heat or ionizing radiation may be applied to cure the heat-dissipating resin composition 210. In step (b), if the underfill material 245, and a solder ball as the conductive member 235 are used, heat used during solder connection and curing of the underfill material can be used to heat cure the heat-dissipating resin composition 210. Alternatively, heat or ionizing radiation can be separately applied to cure the heat-dissipating resin composition 210, without using heat during solder connection and curing of the underfill material. If an anisotropic conductive material is used as the conductive member without using the underfill material, heat or ionizing radiation can be separately applied to cure the heat-dissipating resin composition 210. Herein, in step (b), pressure may be applied if necessary. In step (c), a heat sink 255 is placed on the applied heat-dissipating resin composition 210, and then if necessary, heated and/or pressurized. When placing the heat sink 255, heat or ionizing radiation may be applied to cure the heat-dissipating resin composition 210. Optionally, in step (d), the heat sink 255 can be raised, and therefore, the heat sink 255 and another member including the semiconductor element 150 can be removed, and thus the members can be reworked.

Figure 3:
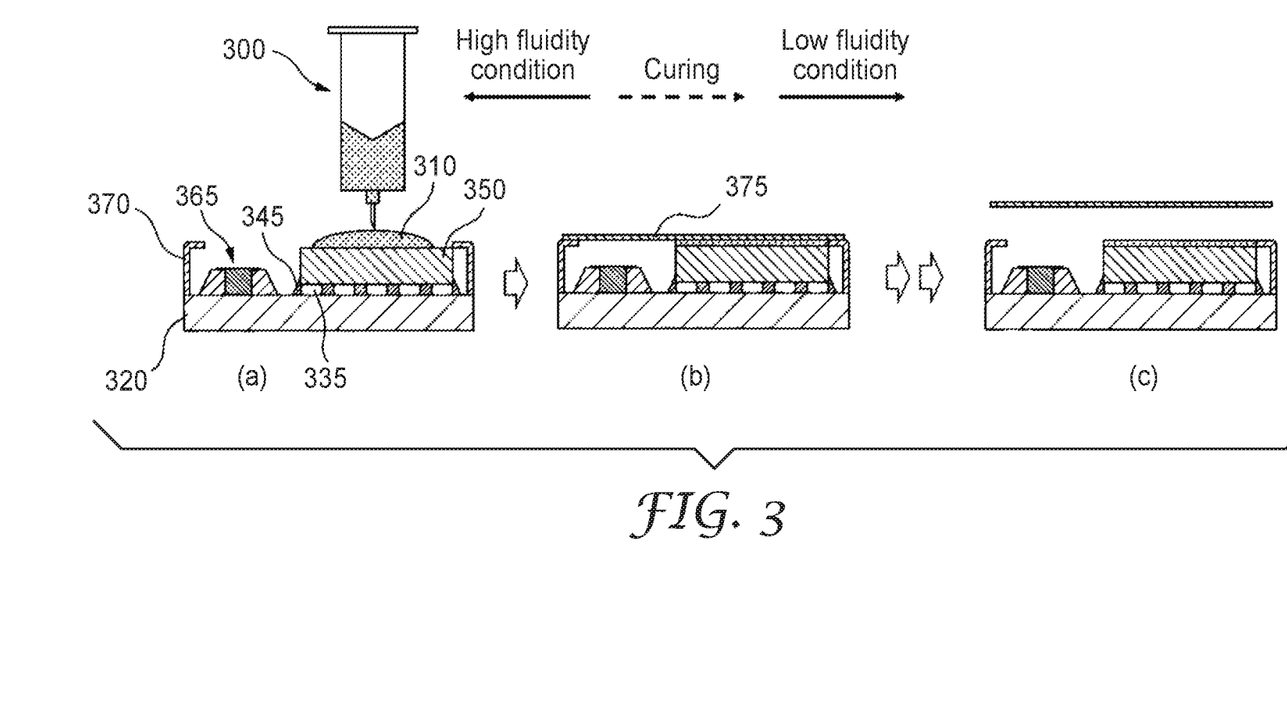
FIG. 3 is a schematic view illustrating another method of using a heat-dissipating resin composition according to an embodiment of the present disclosure.

FIG. 3 illustrates a method of mounting a semiconductor element inside a shield can, which includes step (a) to step (c). In step (a), a substrate 320 having a first surface with a capacitor 365, shield can 370, and electrode (not illustrated in the drawing), and a semiconductor element 350 having a first surface with an electrode (not illustrated in the drawing) and a second surface on an opposite side from the first surface are placed such that the first surfaces of both members are facing each other, with an underfill material 345 and/or conductive member 335 such as a solder ball, anisotropic conductive material, or the like provided therebetween, and then a heat-dissipating resin composition 310 is coated onto the second surface of the semiconductor element 350 from a cylinder 300 containing the heat-dissipating resin composition. Herein, heat or ionizing radiation may be applied to cure the heat-dissipating resin composition 310. In step (b), if the underfill material 345, and a solder ball as the conductive member 335 are used, the heat used during solder connecting and curing of the underfill material can be used to heat cure the heat-dissipating resin composition 310. Alternatively, heat or ionizing radiation can be separately applied to cure the heat-dissipating resin composition 310, without using heat during solder connecting and curing of the underfill material. If an anisotropic conductive material is used as the conductive member without using the underfill material, heat or ionizing radiation can be separately applied to cure the heat-dissipating resin composition 310. Next, a shield can lid 375 is placed on the heat-dissipating resin composition 310, and then if necessary, heated and/or pressurized. At this time, the heat-dissipating resin composition 310 may be cured by applying heat and/or ionizing radiation. Optionally, in step (c), the shield can lid 375 can be raised, and therefore, the shield can lid 375 and another member including the semiconductor element 350 can be removed, and thus the members can be reworked.

Figure 4:
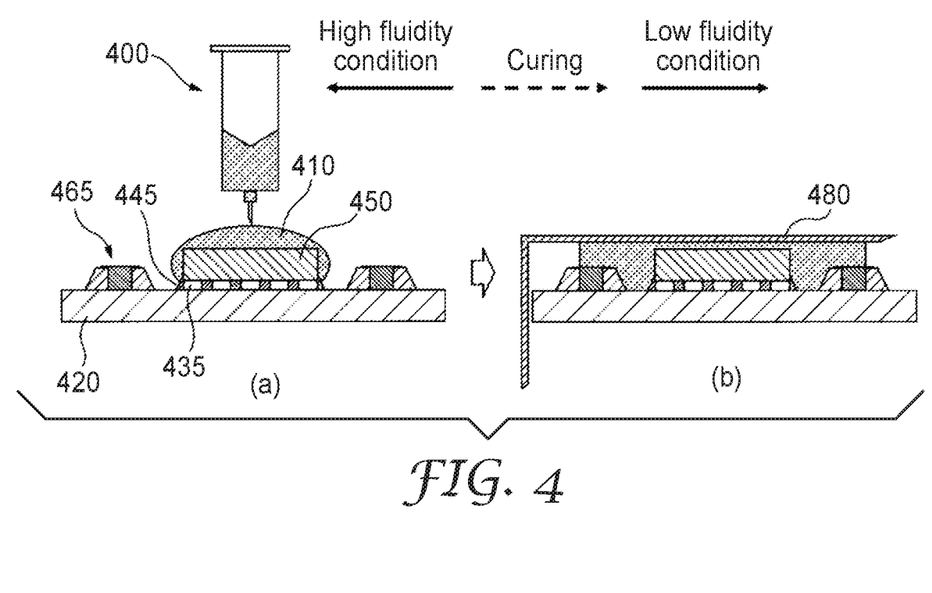
FIG. 4 is a schematic view illustrating another method of using a heat-dissipating resin composition according to an embodiment of the present disclosure.

FIG. 4 illustrates a method of mounting a semiconductor element inside a housing, which includes step (a) and step (b). In step (a), a substrate 420 having a first surface with a capacitor 465 and electrode (not illustrated in the drawing), and a semiconductor element 450 having a first surface with an electrode (not illustrated in the drawing) and a second surface on an opposite side from the first surface are placed such that the first surfaces of both members are facing each other, with an underfill material 445 and/or conductive member 435 such as a solder ball, anisotropic conductive material, or the like provided therebetween, and then heated and/or pressurized to join, and then a large amount of a heat-dissipating resin composition 410 is coated onto the second surface of the semiconductor element 450, from a cylinder 400 containing the heat-dissipating resin composition. Heat or ionizing radiation can be applied to the coated heat-dissipating resin composition 410 to perform curing. In step (b), a housing 480 is placed on the heat-dissipating resin composition 410, and if necessary, heated and/or pressurized such that the heat-dissipating resin composition 410 is spread over an area that exceeds that of the second surface of the semiconductor element 450. At this time, the heat-dissipating resin composition 410 may be cured by applying heat and/or ionizing radiation. Although not illustrated in the drawing, the housing 480 can be raised or the like, if necessary, to remove the housing 480 and another member including the semiconductor element 450, and thus the members can be reworked. As described in the illustrative embodiments, if the cured product of the heat-dissipating resin composition is laterally spread beyond the semiconductor element, the contact area between the cured product and housing increases, and therefore, heat from a heat-generating part such as the semiconductor element or the like can be dispersed over a wide area on the housing, which can relieve a local increase in the housing temperature.

EXAMPLES

In the following examples, specific embodiments of the present disclosure are described by way of example, but the present invention is not limited thereto. All parts and percentages are by mass unless otherwise indicated.

Raw materials and the like used in the examples are shown below in Table 1.

TABLE 1

| Product name | Description | Supplier |
|---|---|---|
| Component (A): YDF-170 | Bisphenol F epoxy resin, Equivalent: 170 g/eq | Nippon Steel & Sumitomo Metal Corporation (Chiyoda-ku, Tokyo, Japan) |
| Component (B): HX3941HP | Latent epoxy resin curing agent | Asahi Kasei Advance Corporation (Chiyoda-ku, Tokyo, Japan) |
| Component C-1: Arufon (registered trademark) UP1020 | Acrylic oligomer without a carboxyl group, Weight average molecular weight: 2000 | Toagosei Co., Ltd. (Minato-ku, Tokyo, Japan) |

TABLE 1-continued

| Product name | Description | Supplier |
|---|---|---|
| Component C-2: Arufon (registered trademark) UC3510 | Acrylic oligomer with a carboxyl group, Weight average molecular weight: 2000, Acid value: 70 mg KOH/g | Toagosei Co., Ltd. (Minato-ku, Tokyo, Japan) |
| Component D: Sumicorundum (registered trademark) | Mixture of alumina with average particle sizes of 18 μm, 1.5 μm, and 0.4 μm (mixing ratio: 20:5:1) | Sumitomo Chemical Co., Ltd. (Chuo-ku, Tokyo, Japan) |
| DISPERBYK (registered trademark)-111 | Dispersant | BYK Japan KK (Shinjuku-ku, Tokyo, Japan) |

Evaluation Method

The properties of the heat-dissipating resin composition of the present disclosure and heat-dissipating cured product which is a cured product thereof were evaluated in accordance with the following methods.

Resin Fluidity After Curing

Figure 5:
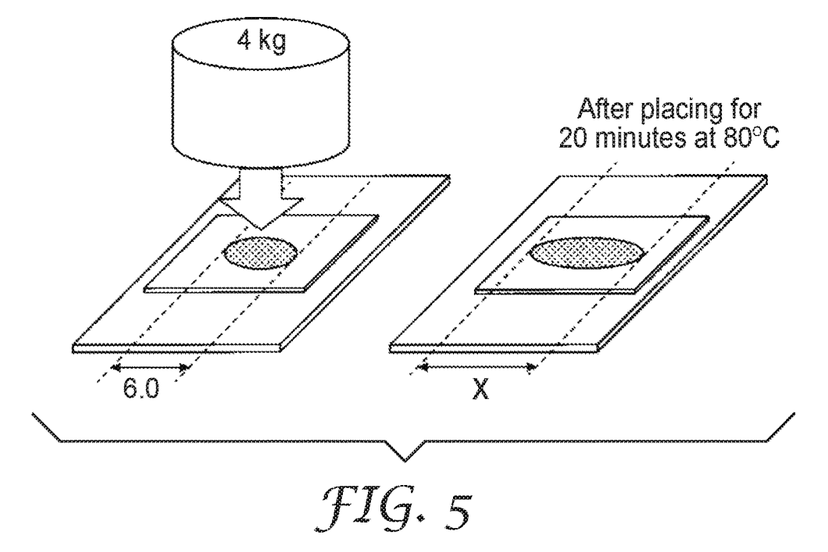
FIG. 5 is a schematic view of a method of evaluating fluidity after curing a heat-dissipating resin composition according to an embodiment of the present disclosure.

As illustrated in FIG. 5, the heat-dissipating resin composition was coated onto an aluminum plate (60 mm×30 mm×1 mm) at a diameter of 6.0 mm and thickness of 180 μm, placed in an oven, and then heated cured for 20 minutes at 150° C. A glass plate (18 mm×18 mm×0.3 mm) was placed on the cured heat-dissipating cured product, and then a 4 kg weight was placed thereon and then placed in an oven for 20 minutes at 80° C. The diameter of the heat-dissipating cured product after curing was measured, and the cured product was denoted as inferior "×" if the diameter was less than 6.1 mm, favorable "Δ" if 6.1 mm or more and less than 7.0 mm, and excellent "○" if 7.0 mm or higher.

Flow Resistance After Curing

Figure 6:
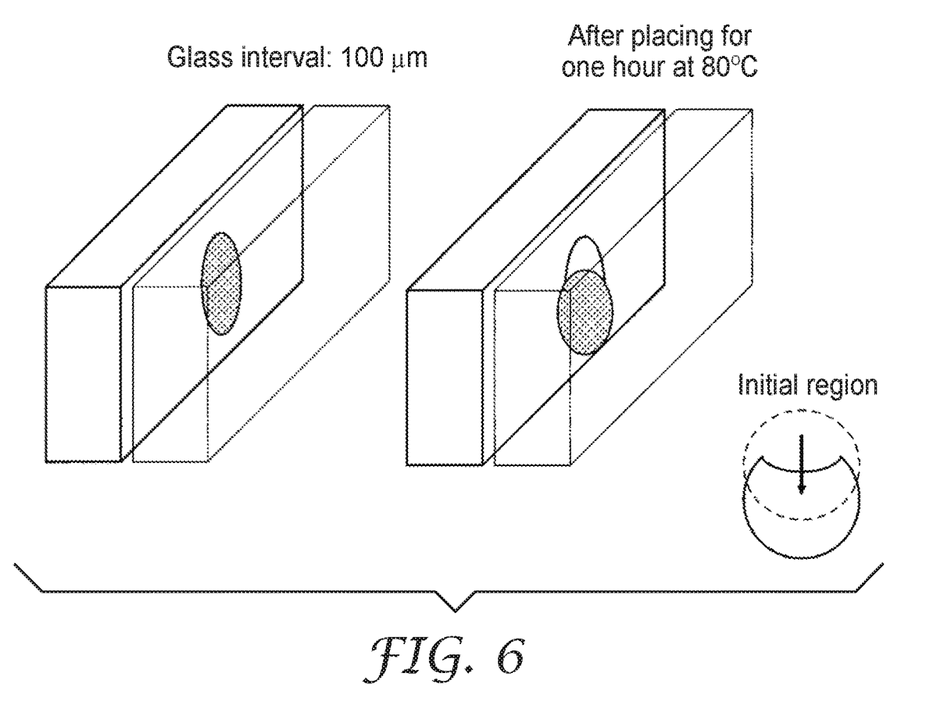
FIG. 6 is a schematic view of a method of evaluating flow resistance after curing a heat-dissipating resin composition according to an embodiment of the present disclosure.

As illustrated in FIG. 6, the heat-dissipating resin composition was coated onto a first glass plate (76 mm×26 mm×1 mm) and then a second glass plate with double-sided tape as a spacer was pressed against the coated heat-dissipating resin composition to prepare a sample where the diameter of the composition was 15 mm and thickness was 100 μm. The heat-dissipating resin composition was placed in an oven and then heated to cure for 20 minutes at 150° C., and then placed for one hour in an oven at 80° C. with a glass surface facing in a vertical direction, and then the amount of the heat-dissipating cured product remaining was measured based on the region in which the product was initially present. The residual rate of the heat-dissipating cured product after curing was denoted as inferior "×" if less than 70%, favorable "Δ" if 70% or higher and less than 85%, and excellent "○" if 85% or higher.

Initial Fluidity (Dispensability)

The heat-dissipating resin composition was placed in a cylinder (PSY-10E manufactured by Musashi Engineering, Inc.), a needle (23G) with a 0.4 mm inner diameter was attached, and then pressurizing with an air pressure of 0.3 MPa was performed using an air dispenser (SuperEx manufactured by Musashi Engineering, Inc.). Heat-dissipating resin compositions that were extrudable by the dispenser were evaluated as acceptable "○", and compositions that were not extrudable were not acceptable "×".

Heat Resistance Measurement

The heat-dissipating resin composition was coated at a thickness of 30 μm onto an aluminum heat sink (46.2 mm×50 mm×21 mm, number of fins: 10, fin thickness: 1.2 mm, interval between fins: 3.8 mm, thickness of base portion: 2.75 mm), placed in an oven, and then heated to cure for 20 minutes at 150° C., a high power resistance measurement module (model number: AE-RA1WX16-1R00 manufactured by Akizuki Denshi) 1Ω (16 W) was attached, and then electricity was applied at a voltage of 10 V and current of 3 A. While cooling the heat sink by a fan, the temperature of the heat sink and high power resistance module was measured, and the temperature difference AT upon reaching steady state was measured. As a reference example, the same measurements were performed using an oil compound G-775 (3.6 W/mK) manufactured by Shin-Etsu Silicones.

Examples 1 to 9, Comparative Example 1

Awatori Rentaro (registered trademark) ARE-310 (manufactured by Thinky), a rotating and revolving mixer, was used to mix the raw materials in Table 1 at the composition ratios in Table 2.

TABLE 2

| Weight Fraction (mass %) | Component (A)($W_A$) | Component (B)($W_B$) | Component (C) ($W_C$) | | $W_C/(W_A+W_B)$ | $W_{C-2}/(W_{C-1}+W_{C-2})$ | Component (D)($W_D$) | Dispersant |
|---|---|---|---|---|---|---|---|---|
| | | | Component (C-1)($W_{C-1}$) | Component (C-2)($W_{C-2}$) | | | | |
| Example 1 | 5.6 | 1.4 | 0 | 8.8 | 1.3 | 1 | 83.5 | 0.7 |
| Example 2 | 4.8 | 1.2 | 0 | 9.7 | 1.6 | 1 | 83.6 | 0.6 |
| Example 3 | 1.4 | 0.4 | 0 | 7.6 | 4.2 | 1 | 90.2 | 0.4 |
| Example 4 | 2.2 | 0.5 | 0 | 11.5 | 4.3 | 1 | 85.2 | 0.5 |
| Example 5 | 1.4 | 0.4 | 0 | 12.6 | 7.0 | 1 | 85.2 | 0.4 |
| Comparative Example 1 | 0.8 | 0.2 | 0 | 13.6 | 13.6 | 1 | 85.0 | 0.4 |
| Example 6 | 1.4 | 0.4 | 7.2 | 5.4 | 7.0 | 0.43 | 85.2 | 0.4 |
| Example 7 | 1.4 | 0.4 | 10.8 | 1.8 | 7.0 | 0.14 | 85.2 | 0.4 |
| Example 8 | 1.4 | 0.4 | 11.9 | 0.7 | 7.0 | 0.06 | 85.2 | 0.4 |
| Example 9 | 1.0 | 0.3 | 0 | 13.1 | 10.1 | 1 | 85.2 | 0.4 |

The results of the resin fluidity after curing, flow resistance, and initial fluidity (dispensability) in the obtained heat-dissipating resin compositions are shown in Table 3, and the results of the heat resistance measurements are shown in Table 4. Note that the initial fluidity (dispensability) is a necessary property if a dispenser is required, but is not an essential property.

TABLE 3

| | Resin Fluidity After Curing | | Flow Resistance After Curing | | |
|---|---|---|---|---|---|
| | Amount of Flow (mm) | Judgment | Residual Rate (%) | Judgment | Initial Fluidity |
| Example 1 | 6.3 | Δ | 100 | ○ | × |
| Example 2 | 6.3 | Δ | 100 | ○ | × |
| Example 3 | >7.0 | ○ | 100 | ○ | ○ |
| Example 4 | >7.0 | ○ | 95 | ○ | ○ |
| Example 5 | >7.0 | ○ | 90 | ○ | ○ |
| Comparative Example 1 | >7.0 | ○ | 50 | × | ○ |
| Example 6 | >7.0 | ○ | 90 | ○ | ○ |
| Example 7 | >7.0 | ○ | 95 | ○ | ○ |
| Example 8 | >7.0 | ○ | 100 | ○ | × |
| Example 9 | >7.0 | ○ | 90 | ○ | ○ |

TABLE 4

| | Example 3 | Example 4 | Example 5 | Example 6 | Example 7 | Example 9 | Reference example |
|---|---|---|---|---|---|---|---|
| Heat Resistance Measurement ΔT | 2.0 | 1.8 | 2.2 | 3.3 | 1.7 | 2.7 | 2.3 |

REFERENCE SIGNS LIST

100, 200, 300, 400 Syringe
110, 210, 310, 410 Heat-dissipating resin composition
120, 220, 320, 420 Substrate
130 Electrode
140 Conductive member
150, 250, 350, 450 Semiconductor element
160 Raising means
235, 335, 435 Conductive member
245, 345, 445 Underfill material
255 Heat sink
365, 465 Capacitor
370 Shield can
375 Shield can lid
480 Housing

The invention claimed is:

1. A heat-dissipating resin composition, comprising:
component (A): epoxy resin;
component (B): curing agent for epoxy resin;
component (C): (meth)acrylic oligomer with weight average molecular weight of 10,000 or less; and
component (D): heat conductive particles,
wherein weight fractions of the components (A) to (C) in the heat-dissipating resin composition are $W_A$, $W_B$, and $W_C$, respectively, $2 \leq W_C/(W_A+W_B) \leq 13$, and
wherein a weight fraction of component (D) in the heat-dissipating resin composition is at least 0.7.

2. The heat-dissipating resin composition according to claim 1, wherein component (C) is a component (C-1): (meth)acrylic oligomer with a weight average molecular weight of 10,000 or less that does not have a carboxyl group, and/or component (C-2): (meth)acrylic oligomer with a weight average molecular weight of 10,000 or less that has a carboxyl group.

3. The heat-dissipating resin composition according to claim 2, wherein weight fractions of the components (C-1) and (C-2) in the heat-dissipating resin composition are $W_{C-1}$ and $W_{C-2}$, respectively, $W_{C-2}/(W_{C-1}+W_{C-2}) > 0.05$.

4. The heat-dissipating resin composition according to claim 1, wherein $2 < W_C/(W_A+W_B) < 10$.

5. A heat-dissipating cured product comprising a reaction product of the heat-dissipating resin composition according to claim 1.

6. The heat-dissipating cured product according to claim 5, wherein plastic deformation is exhibited.

7. A method for mounting a semiconductor element, comprising the steps of:
(1) applying onto a substrate with an electrode the heat-dissipating resin composition according to claim 1, and optionally curing the heat-dissipating resin composition by heat or ionizing radiation;
(2) placing a semiconductor element with an electrode on the applied heat-dissipating resin composition or heat-dissipating cured product, and if necessary, heating and/or pressurizing, wherein the substrate and electrode of the semiconductor element are joined through a conductive member;
(3) curing the heat-dissipating resin composition by heat or ionizing radiation, if the heat-dissipating resin composition was not cured in the aforementioned step (1); and
(4) optionally reworking by removing the substrate and semiconductor element; wherein the aforementioned curing step (3) is performed during step (1) or step (2) if curing was not performed during step (1).

8. A method of mounting a semiconductor element and heat sink, comprising the steps of:
(1) placing a substrate having a first surface with an electrode, and a semiconductor element having a first surface with an electrode and a second surface opposite from the first surface such that the first surfaces are facing each other, through an underfill agent and/or conductive member;

(2) applying onto the second surface of the semiconductor element the heat-dissipating resin composition according to claim 1, and optionally curing the heat dissipating resin composition by heat or ionizing radiation;
(3) heating and/or pressurizing such that in step (3), the semiconductor element and substrate are joined, where step (3) is performed after the aforementioned step (1) or step (2);
(4) placing a heat sink on the applied heat-dissipating resin composition or heat-dissipating cured product, and then if necessary, heating and/or pressurizing;
(5) curing the heat-dissipating resin composition by heat or ionizing radiation, if the heat-dissipating resin composition was not cured in the aforementioned step (2); and
(6) optionally reworking by removing the heat sink and semiconductor element; wherein the aforementioned curing step (5) is performed during any of step (3) to step (4) if curing was not performed during step (2).

9. A method of mounting a semiconductor element inside a shield can, comprising the steps of:
(1) placing a substrate having a first surface with a shield can and an electrode, and a semiconductor element having a first surface with an electrode and a second surface on an opposite side from the first surface, placed inside the shield can, such that the first surfaces are facing each other, with an underfill agent and/or conductive member provided therebetween;
(2) applying onto the second surface of the semiconductor element the heat-dissipating resin composition according to claim 1, and optionally curing the heat-dissipating resin composition by heat or ionizing radiation;
(3) heating and/or pressurizing such that in step (3), the semiconductor element and substrate are joined, where step (3) is performed after the aforementioned step (1) or step (2);
(4) placing a shield can lid on the applied heat-dissipating resin composition or heat-dissipating cured product, and then if necessary, heating and/or pressurizing;
(5) curing the heat-dissipating resin composition by heat or ionizing radiation, if the heat-dissipating resin composition was not cured in the aforementioned step (2); and
(6) optionally reworking by removing the shield can lid and semiconductor element;
wherein the aforementioned curing step (5) is performed during any of step (3) to step (4) if curing was not performed during step (2).

* * * * *

UNITED STATES PATENT AND TRADEMARK OFFICE
CERTIFICATE OF CORRECTION

PATENT NO. : 11,124,646 B2  
APPLICATION NO. : 16/320639  
DATED : September 21, 2021  
INVENTOR(S) : Kohichiro Kawate Page 1 of 1

It is certified that error appears in the above-identified patent and that said Letters Patent is hereby corrected as shown below:

In the Claims

<u>Column 18</u>

Line 7, In Claim 3, delete "$W_{C-2}/(W_{C-1} + W_{C-2}) > 0.05$" and insert -- $W_{C-2}/(W_{C-1} + W_{C-2}) \geq 0.05$ --, therefor.

Line 35, In Claim 4, delete "$2 < Wc/(W_A + W_B) < 10$" and insert -- $2 \leq Wc/(W_A + W_B) \leq 10$ --, therefor.

Line 58, In Claim 7, delete "step (1) or step (2)" and insert -- step (2) --, therefor.

Signed and Sealed this  
Twenty-eighth Day of December, 2021

Drew Hirshfeld  
*Performing the Functions and Duties of the*  
*Under Secretary of Commerce for Intellectual Property and*  
*Director of the United States Patent and Trademark Office*